United States Patent
Kim et al.

(10) Patent No.: US 12,191,632 B2
(45) Date of Patent: Jan. 7, 2025

(54) TERAHERTZ WAVE GENERATING APPARATUS USING DUAL MODE LASER

(71) Applicant: ELECTRONICS AND TELECOMMUNICATIONS RESEARCH INSTITUTE, Daejeon (KR)

(72) Inventors: Hyun Soo Kim, Daejeon (KR); Kyung Hyun Park, Daejeon (KR); Eui Su Lee, Sejong-si (KR); Il Min Lee, Daejeon (KR); Kiwon Moon, Daejeon (KR); Dong Woo Park, Sejong-si (KR); Jun-Hwan Shin, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 990 days.

(21) Appl. No.: 17/183,680

(22) Filed: Feb. 24, 2021

(65) Prior Publication Data

US 2021/0281045 A1  Sep. 9, 2021

(30) Foreign Application Priority Data

Mar. 5, 2020  (KR) .................. 10-2020-0027707

(51) Int. Cl.
*H01S 5/06* (2006.01)
*H01L 31/08* (2006.01)
(Continued)

(52) U.S. Cl.
CPC .............. *H01S 5/068* (2013.01); *H01L 31/08* (2013.01); *H01L 31/09* (2013.01); *H01S 5/026* (2013.01);
(Continued)

(58) Field of Classification Search
None
See application file for complete search history.

(56) References Cited

U.S. PATENT DOCUMENTS

| | | |
|---|---|---|
| 4,642,804 A | 2/1987 | Personick |
| 6,697,186 B2 | 2/2004 | Riken |
| (Continued) | | |

FOREIGN PATENT DOCUMENTS

| | | | | |
|---|---|---|---|---|
| CN | 108923259 A | * | 11/2018 | ........... H01S 5/1231 |
| EP | 2509173 A1 | * | 10/2012 | ............. H01S 5/026 |
| (Continued) | | | | |

OTHER PUBLICATIONS

H. Q. Hou et al., "Nearly Chirp-Free Electroabsorption Modulation Using InGaAs—InGaAlAs—InAlAs Coupled Quantum Wells," IEEE Photonics Technology Letters, vol. 7, No. 2, Feb. 1995, pp. 167-169.
(Continued)

*Primary Examiner* — Eric L Bolda
(74) *Attorney, Agent, or Firm* — Rabin & Berdo, P.C.

(57) ABSTRACT

Disclosed is a terahertz wave generating apparatus. The terahertz wave generating apparatus includes a dual mode laser including a first single mode laser that generates a first beating signal, a gain adjustment region that modulates the first beating signal, and a second single mode laser that generates a second beating signal, and a photomixer that mixes the modulated first beating signal and the second beating signal, and that modulates a current supplied based on a beating frequency of the mixed beating signals to generate a terahertz wave signal, and the gain adjustment region is formed between the first single mode laser and the second single mode laser, and the first beating signal is output from the first single mode laser to the gain adjustment region and is modulated based on a reverse bias voltage supplied to the gain adjustment region.

16 Claims, 11 Drawing Sheets

(51) Int. Cl.
*H01L 31/09* (2006.01)
*H01S 5/026* (2006.01)
*H01S 5/068* (2006.01)
*H01S 5/12* (2021.01)
*H01S 5/40* (2006.01)

(52) U.S. Cl.
CPC .............. *H01S 5/0601* (2013.01); *H01S 5/12* (2013.01); *H01S 5/4012* (2013.01)

(56) References Cited

U.S. PATENT DOCUMENTS

| | | |
|---|---|---|
| 8,599,893 B2 | 12/2013 | Kim et al. |
| 8,774,243 B2 | 7/2014 | Kim et al. |
| 2010/0067918 A1 | 3/2010 | Federici et al. |
| 2014/0264681 A1* | 9/2014 | Demers ................ H01Q 1/2283 257/431 |

FOREIGN PATENT DOCUMENTS

| | | |
|---|---|---|
| JP | 2002072269 A | 3/2002 |
| JP | 2012222352 A | 11/2012 |
| KR | 20070088356 A | 8/2007 |
| KR | 20120020961 A | 3/2012 |
| KR | 101453472 B1 | 10/2014 |

OTHER PUBLICATIONS

Kenji Sato et al., "Chirp Characteristics of 40-GB/s Directly Modulated Distributed-Feedback Laser Diodes," Journal of Lightwave Technology, vol. 23, No. 11, Nov. 2005, pp. 3790-3797.

Tadao Nagatsuma et al., "Terahertz wireless communications based on photonics technologies," Optics Express, Oct. 7, 2013, vol. 21, No. 20, pp. 23736-23747.

Z. Yang et al., "Chirp-Enhanced Direct Modulation of a Monolithic Sub-Terahertz Dual Laser Transmitter," IEEE, 2013, pp. 60-63.

* cited by examiner

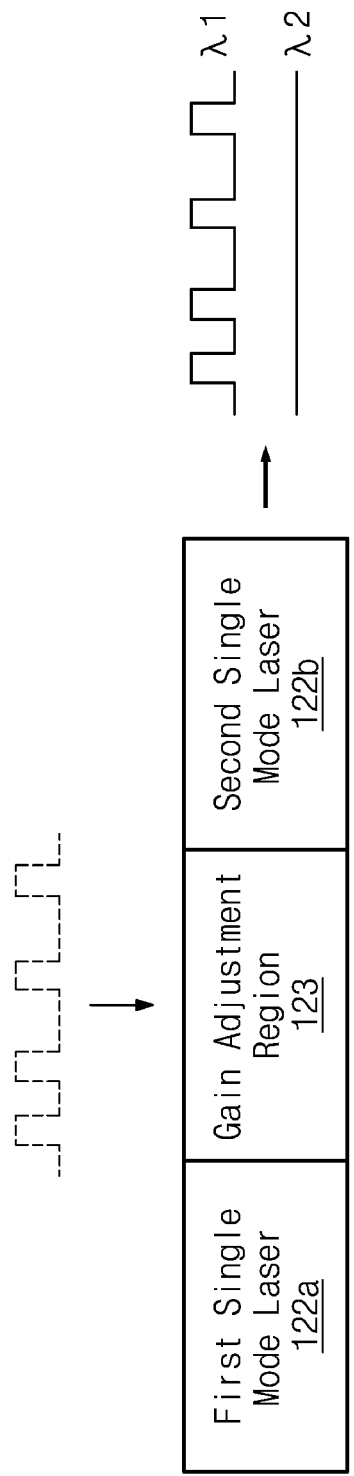

TERAHERTZ WAVE GENERATING APPARATUS USING DUAL MODE LASER

CROSS-REFERENCE TO RELATED APPLICATIONS

This application claims priority under 35 U.S.C. § 119 to Korean Patent Application No. 10-2020-0027707 filed on Mar. 5, 2020, in the Korean Intellectual Property Office, the disclosures of which are incorporated by reference herein in their entireties.

BACKGROUND

Embodiments of the present disclosure described herein relate to terahertz wireless communication, and more particularly, relate to a terahertz wave generating apparatus using a dual mode laser.

As the use of mobile devices expands and multimedia services increase, the need for broadband short-range wireless communication for innovative next-generation communication is emerging. As the amount of communication increases, the speed of wireless communication is also required to increase. To increase the speed of wireless communication, it is necessary to increase a carrier frequency basically. In the recently commercialized 5G wireless communication, the carrier frequency has been increased to improve a transmission speed compared to 4G wireless communication, and carrier frequency bands of 3.5 GHz and 28 GHz have been allocated for the 5G wireless communication.

6G wireless communication, which is the next generation wireless communication, requires a higher transmission rate. When the 6G wireless communication is introduced, the speed of wireless communication will be similar to that of wired communication. To implement the wireless communication speed similar to that of the wired communication, the wireless communication network needs to use a carrier frequency of 100 GHz or higher. Therefore, a terahertz band wireless network may be used to construct the 6G wireless communication network.

The terahertz wave refers to an electromagnetic wave with a frequency of 0.1 to 10 THz (1 THz=$10^{12}$ Hz). Since the terahertz wave has a shorter wavelength than a millimeter wave, it has high linearity and can focus a beam, and has higher transmittance to non-metallic or non-polar materials than visible and infrared rays. In addition, since the photon energy of the terahertz wave is only a few meV, the use of the terahertz wave is harmless to the human body, and the application range is wide. To commercialize terahertz wave based on the above-described advantages, there is a need for research on an apparatus for generating the terahertz wave with higher efficiency.

SUMMARY

Embodiments of the present disclosure provide a terahertz wave generating apparatus using a dual mode laser.

According to an embodiment of the present disclosure, a terahertz wave generating apparatus includes a dual mode laser including a first single mode laser that generates a first beating signal, a gain adjustment region that modulates the first beating signal, and a second single mode laser that generates a second beating signal, and a photomixer that mixes the modulated first beating signal and the second beating signal, and modulates a current supplied based on a beating frequency of the mixed beating signals to generate a terahertz wave signal, and the gain adjustment region is formed between the first single mode laser and the second single mode laser, and the first beating signal is output from the first single mode laser to the gain adjustment region and is modulated based on a reverse bias voltage supplied to the gain adjustment region.

According to an embodiment, the first single mode laser may include a first diffraction grating, a first gain layer, and a first electrode plate, the gain adjustment region may include an absorption layer and a second electrode plate, and the second single mode laser may include a second diffraction grating, a second gain layer, and a third electrode plate.

According to an embodiment, a diffraction period of the first diffraction grating may be different from that of the second diffraction grating.

According to an embodiment, the first gain layer, the absorption layer, and the second gain layer may be formed of the same material.

According to an embodiment, the first single mode laser, the gain adjustment region, and the second single mode laser may be formed on the same substrate.

According to an embodiment, the substrate may be one of a gallium arsenide (GaAs) substrate, an indium phosphide (InP) substrate, and a gallium nitride (GaN) substrate.

According to an embodiment, at least one of the first single mode laser and the second single mode laser may be a wavelength tunable single mode laser.

According to an embodiment, the first single mode laser and the second single mode laser may be one of a distributed feedback laser diode (DFB LD), a distributed Bragg reflector laser diode (DBR LD), and a sampled grating distributed Bragg reflector laser diode (SGDBR LD).

According to an embodiment, the photomixer may include a coupler and a photo-electric converter.

According to an embodiment, the photomixer may be one of a unitravelling carrier photodiode (UTC-PD), an evanescent photodiode (EC-PD), and a low temperature grown photomixer (LTG Photomixer).

According to an embodiment of the present disclosure, a terahertz wave generating apparatus includes a dual mode laser including a first single mode laser that generates a first beating signal, a gain adjustment region that modulates the first beating signal, and a second single mode laser that generates a second beating signal, a semiconductor optical amplifier that amplifies the modulated first beating signal and the second beating signal, and a photomixer that mixes the modulated first beating signal and the second beating signal that are amplified from the semiconductor optical amplifier and that modulates a current supplied based on a beating frequency of the mixed beating signals to generate a terahertz wave signal, and the gain adjustment region is formed between the first single mode laser and the second single mode laser, and the first beating signal is output from the first single mode laser to the gain adjustment region and is modulated based on a reverse bias voltage supplied to the gain adjustment region.

According to an embodiment, the first single mode laser may include a first diffraction grating, a first gain layer, and a first electrode plate, the gain adjustment region may include an absorption layer and a second electrode plate, and the second single mode laser may include a second diffraction grating, a second gain layer, and a third electrode plate.

According to an embodiment, a diffraction period of the first diffraction grating may be different from that of the second diffraction grating.

According to an embodiment, the first gain layer, the absorption layer, and the second gain layer may be formed of the same material.

According to an embodiment, the first single mode laser, the gain adjustment region, and the second single mode laser may be formed on the same substrate.

According to an embodiment, at least one of the first single mode laser and the second single mode laser may be a wavelength tunable single mode laser.

BRIEF DESCRIPTION OF THE FIGURES

The above and other objects and features of the present disclosure will become apparent by describing in detail embodiments thereof with reference to the accompanying drawings.

FIG. 9 is a diagram describing an effect of mitigating a frequency chirping phenomenon of a light signal generated by a dual mode laser according to an embodiment of the present disclosure.

DETAILED DESCRIPTION

Figure 1:
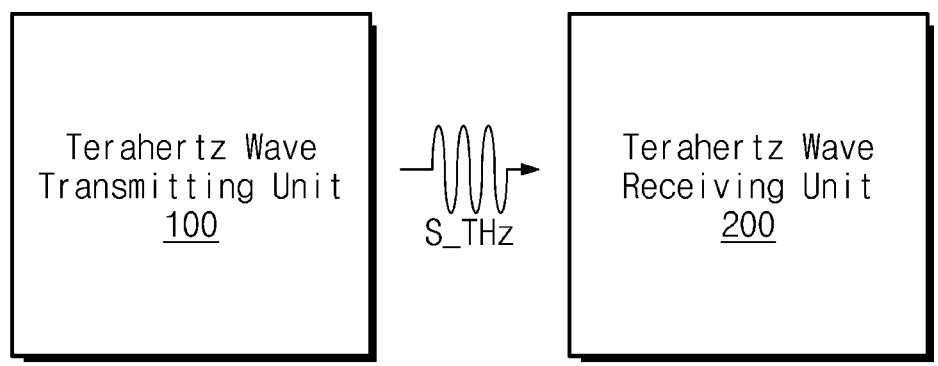
FIG. 1 is a block diagram illustrating a terahertz wave wireless communication system according to an embodiment of the present disclosure.

Hereinafter, embodiments of the present disclosure will be described clearly and in detail such that those skilled in the art may easily carry out the present disclosure.

The terms used in the present specification are for describing embodiments, and are not intended to limit the present disclosure. In the present specification, the singular form also includes the plural form unless otherwise specified in the phrase. As used herein, "comprises and/or comprising" does not exclude the presence or addition of one or more other components, steps, operations and/or elements to the mentioned components, steps, operations and/or elements.

Unless otherwise defined, all terms (including technical and scientific terms) used in the present specification may be used as meanings commonly understood by those skilled in the art to which the present disclosure pertains. In addition, terms defined in the commonly used dictionary are not interpreted ideally or excessively unless explicitly defined specifically. In the present specification, the same reference numerals may refer to the same components throughout the entire text.

FIG. 1 is a block diagram illustrating a terahertz wave wireless communication system according to an embodiment of the present disclosure.

Referring to FIG. 1, a terahertz wave wireless communication system 1000 according to an embodiment of the present disclosure may include a terahertz wave transmitting unit 100 and a terahertz wave receiving unit 200.

The terahertz wave transmitting unit 100 may generate a terahertz wave signal S_THz for terahertz wireless communication. The terahertz wave signal S_THz may include a baseband signal including information to be transmitted. The terahertz wave transmitting unit 100 may include a beating light source. The beating light source may include a first light source and a second light source that generate a beating signal. Each of the first light source and the second light source may be a single mode laser. The first light source and the second light source included in the beating light source may have different oscillation frequencies to each other. A difference between the oscillation frequencies of the first light source and the second light source is referred to as a beating frequency.

The terahertz wave transmitting unit 100 according to an embodiment of the present disclosure may mix two beating signals having different frequencies that are generated from the first light source and the second light source. The terahertz wave transmitting unit 100 may mix two beating signals and may generate the terahertz wave signal S_THz, which is a continuous wave of a terahertz band, based on the mixed beating signals. The terahertz wave signal S_THz generated by the terahertz wave transmitting unit 100 may be radiated into free space.

The terahertz wave receiving unit 200 may receive the radiated terahertz wave signal S_THz. The terahertz wave receiving unit 200 may detect and amplify the received terahertz wave signal S_THz. The terahertz wave receiving unit 200 may restore a baseband signal included in the received terahertz wave signal S_THz.

Although a quantum cascade laser (QCL) capable of directly generating the terahertz wave may be used to generate the terahertz wave, the present disclosure uses the beating light source to overcome problems such as an issue of room temperature operation and limited broadband characteristics of the quantum cascade laser. In addition, to mitigate a frequency chirping phenomenon that may occur when the beating signal generated from the beating light source is directly modulated, the present disclosure uses a dual mode laser that directly applies an electric signal to a gain adjustment region. A configuration of the dual mode laser and an effect of mitigating the frequency chirping phenomenon will be described in detail later with reference to FIGS. 4 and 9.

Figure 2:
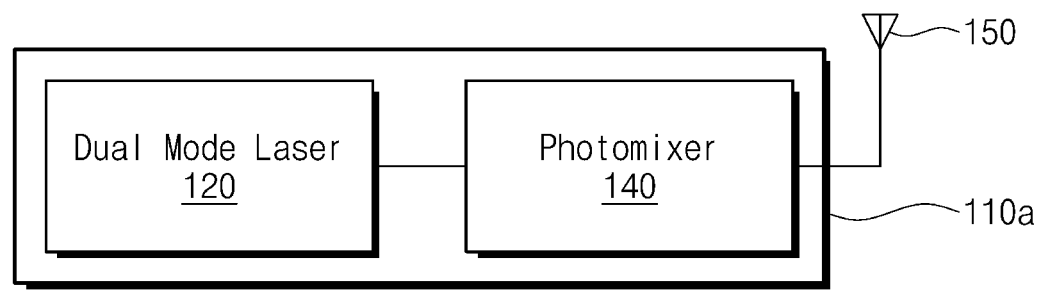
FIG. 2 is a block diagram illustrating a configuration of a terahertz wave transmitting unit according to an embodiment of the present disclosure.

FIG. 2 is a block diagram illustrating a configuration of a terahertz wave transmitting unit according to an embodiment of the present disclosure.

Referring to FIG. 2, a terahertz wave transmitting unit 100a according to an embodiment of the present disclosure may include a terahertz wave generating apparatus 110a and a transmitting antenna 150. The terahertz wave generating apparatus 110*a* may include a dual mode laser (DML) 120 and a photomixer 140. The dual mode laser 120 is a kind of the beating light source.

The terahertz wave generating apparatus 110*a* may generate the terahertz wave signal S_THz (refer to FIG. 1). The dual mode laser 120 included in the terahertz wave generating apparatus 110*a* may include a first light source and a second light source. The first light source and the second light source may be a single mode laser. The first light source may generate a first beating signal. The second light source may generate a second beating signal. The first beating signal and the second beating signal generated by the dual mode laser 120 may be incident on the photomixer 140. The physical characteristics of the terahertz wave signal S_THz generated by the terahertz wave generating apparatus 110*a* may be determined by a laser line width, noise characteristics, a tuning range, and a phase stability of the first light source and the second light source included in the dual mode laser 120.

The photomixer 140 may mix the first beating signal and the second beating signal generated from the dual mode laser 120. The photomixer 140 may modulate a current supplied to the photomixer 140, based on a beating frequency of the mixed beating signals. The photomixer 140 may generate the terahertz wave signal S_THz, based on the modulated current. The terahertz wave signal S_THz may be output to the transmitting antenna 150 that is connected in series to the photomixer 140. The transmitting antenna 150 may radiate the terahertz wave signal S_THz into a free space.

Figure 3:
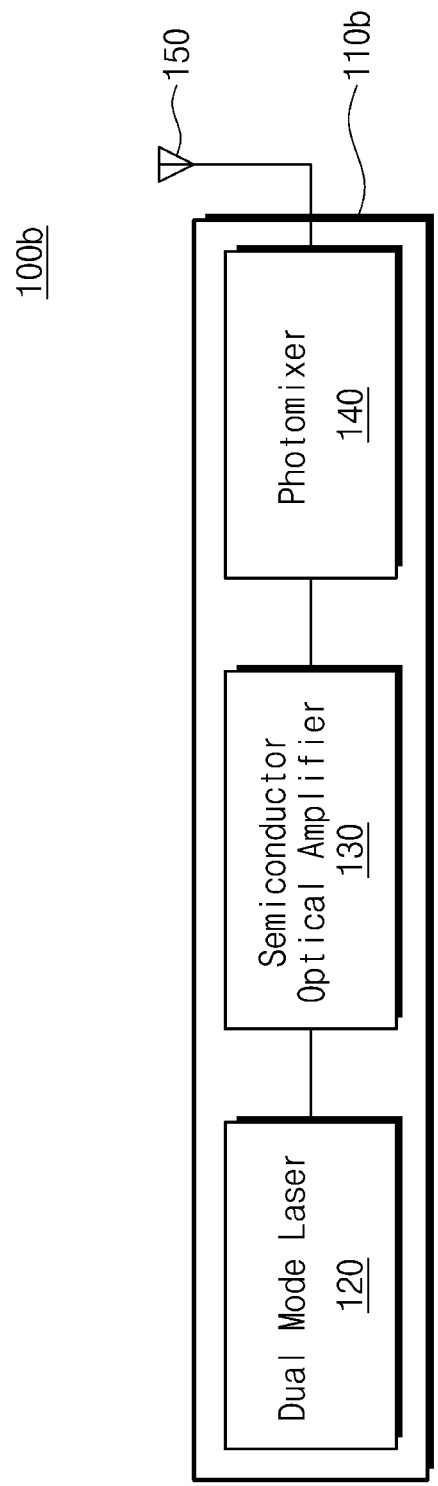
FIG. 3 is a block diagram illustrating another configuration of a terahertz wave transmitting unit according to an embodiment of the present disclosure.

FIG. 3 is a block diagram illustrating another configuration of a terahertz wave transmitting unit according to an embodiment of the present disclosure.

Referring to FIG. 3, a terahertz wave transmitting unit 100*b* according to another embodiment of the present disclosure may include a terahertz wave generating apparatus 110*b* and the transmitting antenna 150. The terahertz wave generating apparatus 110*b* may include the dual mode laser 120, a semiconductor optical amplifier (SOA) 130, and the photomixer 140.

The terahertz wave generating apparatus 110*b* may generate the terahertz wave signal S_THz (refer to FIG. 1). The dual mode laser 120 included in the terahertz wave generating apparatus 110*b* may include the first light source and the second light source. The first light source and the second light source may be a single mode laser. The first light source may generate the first beating signal. The second light source may generate the second beating signal. When the first light source and the second light source are semiconductor-based laser light, a light intensity of the first beating signal and the second beating signal may be weak. Accordingly, to amplify the light intensity, the first beating signal and the second beating signal generated by the dual mode laser 120 may be incident on the semiconductor optical amplifier 130.

The semiconductor optical amplifier 130 may receive and amplify the first beating signal and the second beating signal that are incident from the dual mode laser 120. The amplified first beating signal and the amplified the second beating signal may be incident on the photomixer 140. The photomixer 140 may mix the amplified signals incident from the semiconductor optical amplifier 130. The photomixer 140 may modulate a current supplied to the photomixer 140, based on the beating frequency of the mixed amplified signals. The photomixer 140 may generate the terahertz wave signal S_THz, based on the modulated current. The terahertz wave signal S_THz may be output to the transmitting antenna 150 that is connected in series to the photomixer 140. The transmitting antenna 150 may radiate the terahertz wave signal S_THz into a free space.

Figure 4:
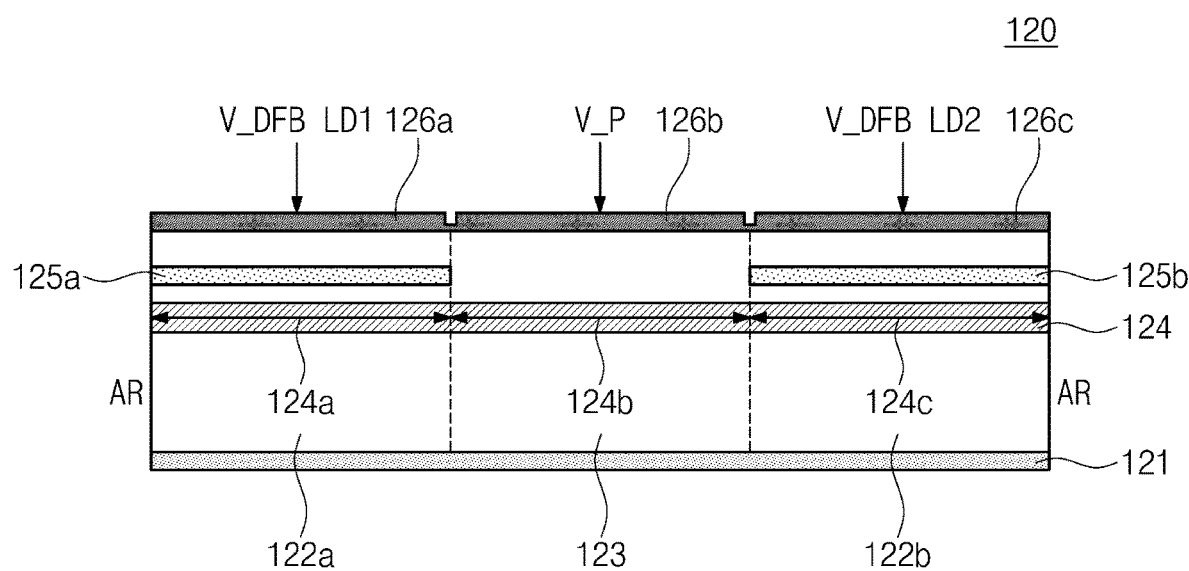
FIG. 4 is a diagram illustrating a configuration of a dual mode laser according to an embodiment of the present disclosure.

FIG. 4 is a diagram illustrating a configuration of a dual mode laser according to an embodiment of the present disclosure.

Referring to FIG. 4, the dual mode laser 120 may include a first single mode laser 122*a*, a gain adjustment region 123, and a second single mode laser 122*b*. The first single mode laser 122*a* and the second single mode laser 122*b* may be stacked on a substrate 121 to be spaced apart. The gain adjustment region 123 may be formed between the first single mode laser 122*a* and the second single mode laser 122*b*. The substrate 121 may be a compound semiconductor substrate. For example, the substrate 121 may be a gallium arsenide (GaAs) substrate, an indium phosphide (InP) substrate, or a gallium nitride (GaN) substrate. The side of the dual mode laser 120 may be coated with anti-reflection (AR).

The first single mode laser 122*a*, the gain adjustment region 123, and the second single mode laser 122*b* may share an active layer 124. The active layer 124 may include InGaAsP, InAlGaAs, or InAlAs. The active layer 124 may have a multi-quantum well (MQW) structure. The first single mode laser 122*a* may include a first diffraction grating 125*a*. A first electrode plate 126*a* may be attached to an upper portion of the first single mode laser 122*a*. A second electrode plate 126*b* may be attached to an upper portion of the gain adjustment region 123. The second single mode laser 122*b* may include a second diffraction grating 125*b*. A third electrode plate 126*c* may be attached to an upper portion of the second single mode laser 122*b*. A diffraction period of the first diffraction grating 125*a* may be different from a diffraction period of the second diffraction grating 125*b*.

The first single mode laser 122*a* and the second single mode laser 122*b* are a distributed feedback laser diode (DFB LD), a distributed Bragg reflector laser diode (DBR LD), a sampled grating distributed Bragg reflector laser diode (SGDBR LD), or a wavelength tunable single mode laser diode. The wavelength tunable single mode laser may be a wavelength tunable single mode laser using an electro-optic (EO) effect or a thermal-optic (TO) effect in an external cavity diode laser (ECDL).

The first single mode laser 122*a* may receive a voltage V_DFB LD1 through the first electrode plate 126*a*. The second single mode laser 122*b* may receive a voltage V_DFB LD2 through the third electrode plate 126*c*. The voltages V_DFB LD1 and V_DFB LD2 applied to the first electrode plate 126*a* and the third electrode plate 126*c* may be a forward bias voltage. An active layer 124*a* included in the first single mode laser 122*a* and an active layer 124*c* included in the second single mode laser 122*b* may operate as a gain layer. Accordingly, the first single mode laser 122*a* and the second single mode laser 122*b* may respectively generate light. In this case, since the diffraction periods of the first and second diffraction gratings are different to each other, an operating wavelength of the first beating signal generated by the first single mode laser 122*a* may be different from an operating wavelength of the second beating signal generated by the second single mode laser 122*b*. The first single mode laser 122*a* may output the first beating signal to the gain adjustment region 123 that is located at the rear end of the first single mode laser 122*a*.

The gain adjustment region 123 may receive a voltage V_P through the second electrode plate 126*b*. The voltage V_P applied to the gain adjustment region may be a reverse bias voltage. An active layer 124b included in the gain adjustment region 123 may operate as an absorbing layer. Accordingly, the gain adjustment region 123 may absorb light. The gain adjustment region 123 may absorb the light and may modulate the first beating signal generated by the first single mode laser 122a. The gain adjustment region 123 may output the modulated first beating signal to the outside of the dual mode laser 120. The second single mode laser 122b may output the generated second beating signal to the outside of the dual mode laser 120. The dual mode laser 120 may output the modulated first and second beating signals to the photomixer 140 (refer to FIG. 2) or the semiconductor optical amplifier 130 (refer to FIG. 3) that are connected in series with the dual mode laser 120.

Figure 5:
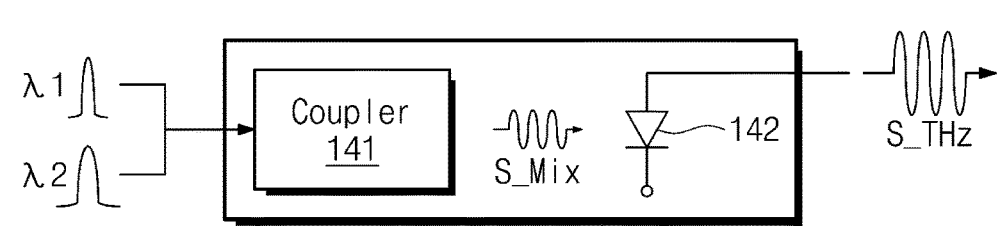
FIG. 5 is a diagram illustrating a configuration of a photomixer according to an embodiment of the present disclosure.

FIG. 5 is a diagram illustrating a configuration of a photomixer according to an embodiment of the present disclosure.

Referring to FIG. 5, the photomixer 140 may include a coupler 141 and an optical-to-electrical converter 142. The photomixer 140 may generate the terahertz wave signal S_THz by using the beating signals generated by the dual mode laser 120 (refer to FIG. 4). The generated terahertz wave signal S_THz may be a terahertz continuous wave. The drawing illustrated in FIG. 5 is intended to help understand the principle of the photomixer 140 and does not limit the structure of the photomixer 140. As an example, the photomixer 140 may be a unitravelling carrier photodiode (UTC-PD), an evanescent photodiode (EC-PD), or a low temperature grown photomixer (LTG Photomixer).

The coupler 141 may generate a mixed beating signal S_Mix by mixing a first beating signal λ1 generated from the first single mode laser 122a (refer to FIG. 4) and a second beating signal λ2 generated from the second single mode laser 122b (refer to FIG. 4) that are included in the dual mode laser 120. The frequency of the mixed beating signal S_Mix is the same as a frequency difference between the first beating signal and the second beating signal. The mixed beating signal S_Mix mixed by the coupler 141 may be incident on the optical-to-electrical converter 142.

The optical-to-electrical converter 142 may generate the terahertz wave signal S_THz by modulating a photocurrent of the photodiode, based on the incident mixed beating signal S_Mix. A magnitude of the terahertz wave signal S_THz may be proportional to the dot product of a light intensity of the first beating signal λ1 and the second beating signal λ2. The terahertz wave signal S_THz generated by the optical-to-electrical converter 142 may be output to the transmitting antenna 150 (refer to FIG. 2) connected in series with the photomixer 140 and may be radiated from the transmitting antenna 150 to a free space.

Figure 6:
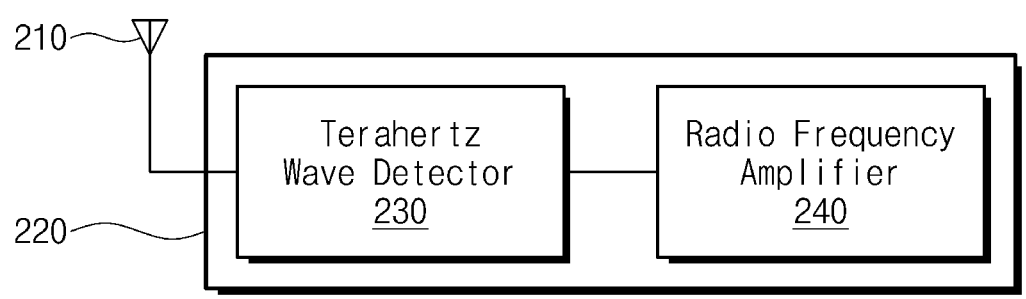
FIG. 6 is a diagram illustrating a configuration of a terahertz wave receiving unit according to an embodiment of the present disclosure.

FIG. 6 is a diagram illustrating a configuration of a terahertz wave receiving unit according to an embodiment of the present disclosure.

Referring to FIG. 6, the terahertz wave receiving unit 200 may include a receiving antenna 210 and a terahertz wave receiving apparatus 220. The terahertz wave receiving apparatus 220 may include a terahertz wave detector 230 and a radio frequency amplifier (RF Amplifier) 240. The terahertz wave signal S_THz radiated into the free space may be received by the receiving antenna 210. The terahertz wave signal S_THz received by the receiving antenna 210 may be output to the terahertz wave detector 230.

The terahertz wave detector 230 may separate a carrier signal and a baseband signal of the input terahertz wave signal S_THz. The terahertz wave detector 230 may use a heterodyne reception method using a Schottky barrier diode (SBD) or a mixer and a local oscillator (LO). The Schottky barrier diode terahertz wave detector may be a terahertz wave detector having a type of III-V based Schottky barrier diode, CMOS (Complementary Metal Oxide Semiconductor) based Schottky barrier diode, or focal plane array (FPA).

The radio frequency amplifier 240 may be connected in series to the rear end of the terahertz wave detector 230. The radio frequency amplifier 240 may receive the baseband signal separated by the terahertz wave detector 230. The radio frequency amplifier 240 may amplify the separated baseband signal. The terahertz wave wireless communication system 1000 (refer to FIG. 1) may analyze transmitted information, based on the separated baseband signal.

Figure 7A:
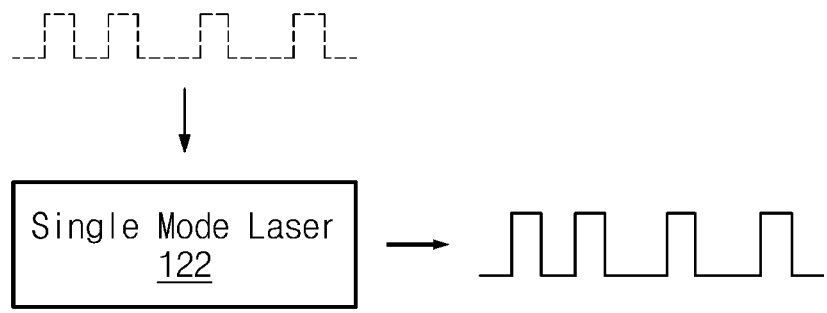
FIG. 7A is a diagram illustrating a principle of generating a light signal when an electric signal is applied to a single mode laser.
Figure 7B:
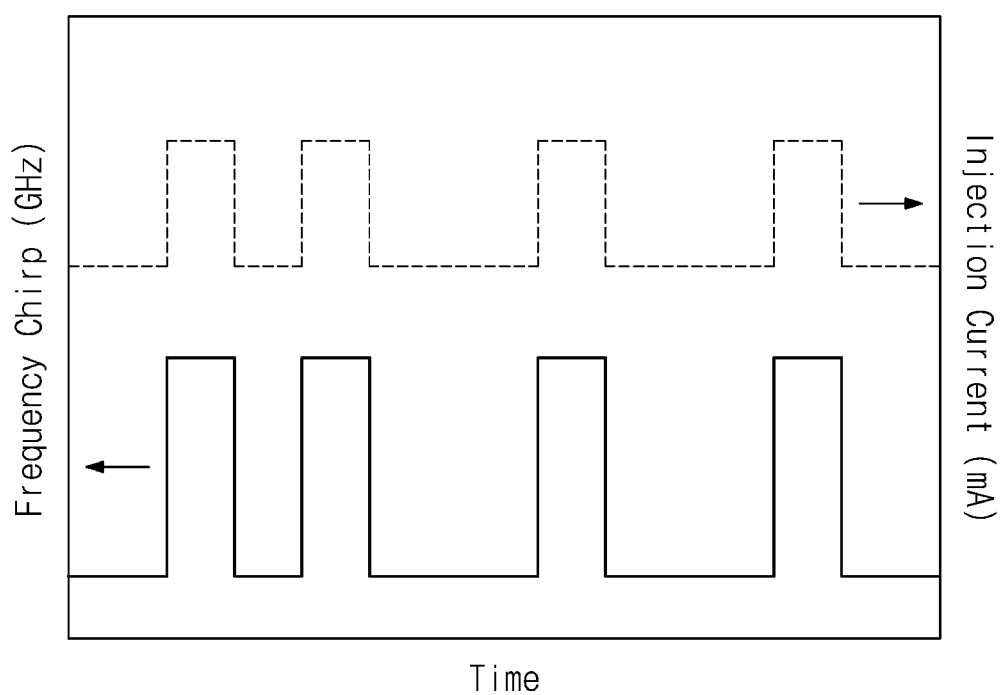
FIG. 7B is a diagram describing a frequency chirping phenomenon occurring in FIG. 7A.

FIG. 7A is a diagram illustrating a principle of generating a light signal when an electric signal is applied to a single mode laser. FIG. 7B is a diagram describing a frequency chirping phenomenon occurring in FIG. 7A.

FIG. 7A is a diagram illustrating that an injection current is directly applied to a single mode laser 122. When the injection current is directly applied to the single mode laser 122, the beating light signal generated from the single mode laser 122 may be directly modulated by the injection current. The single mode laser 122 has a unique effective refractive index depending on a gain medium, but the operating wavelength of the single mode laser 122 may be determined based on the period of the diffraction grating included in the single mode laser 122 and the injection current. When the diffraction grating included in the single mode laser 122 is a Bragg grating, an oscillation wavelength may be determined based on Equation 1 below. In Equation 1, λ is the oscillation wavelength, $n_{eff}$ is the effective refractive index of the gain medium, and Λ is the period of the diffraction grating.

$$\lambda = 2 \cdot n_{eff} \cdot \Lambda \qquad \text{[Equation 1]}$$

In this case, when a high-speed injection current is directly applied to the single mode laser 122, the effective refractive index of the gain medium of the single mode laser 122 changes. When the effective refractive index of the gain medium is changed by the injection current, frequency chirping characteristics of the oscillation wavelength may appear. The chirping refers to a phenomenon in which the oscillation frequency is changed depending on the change in the effective refractive index. A dotted line of FIG. 7B indicates an amount of injection current applied to the single mode laser 122 over time. A solid line of FIG. 7B indicates a frequency chirp of the oscillation wavelength over time. When a current is directly injected into the single mode laser 122, the frequency chirping phenomenon occurs in which the frequency of the light signal continuously changes over time.

Figure 8A:
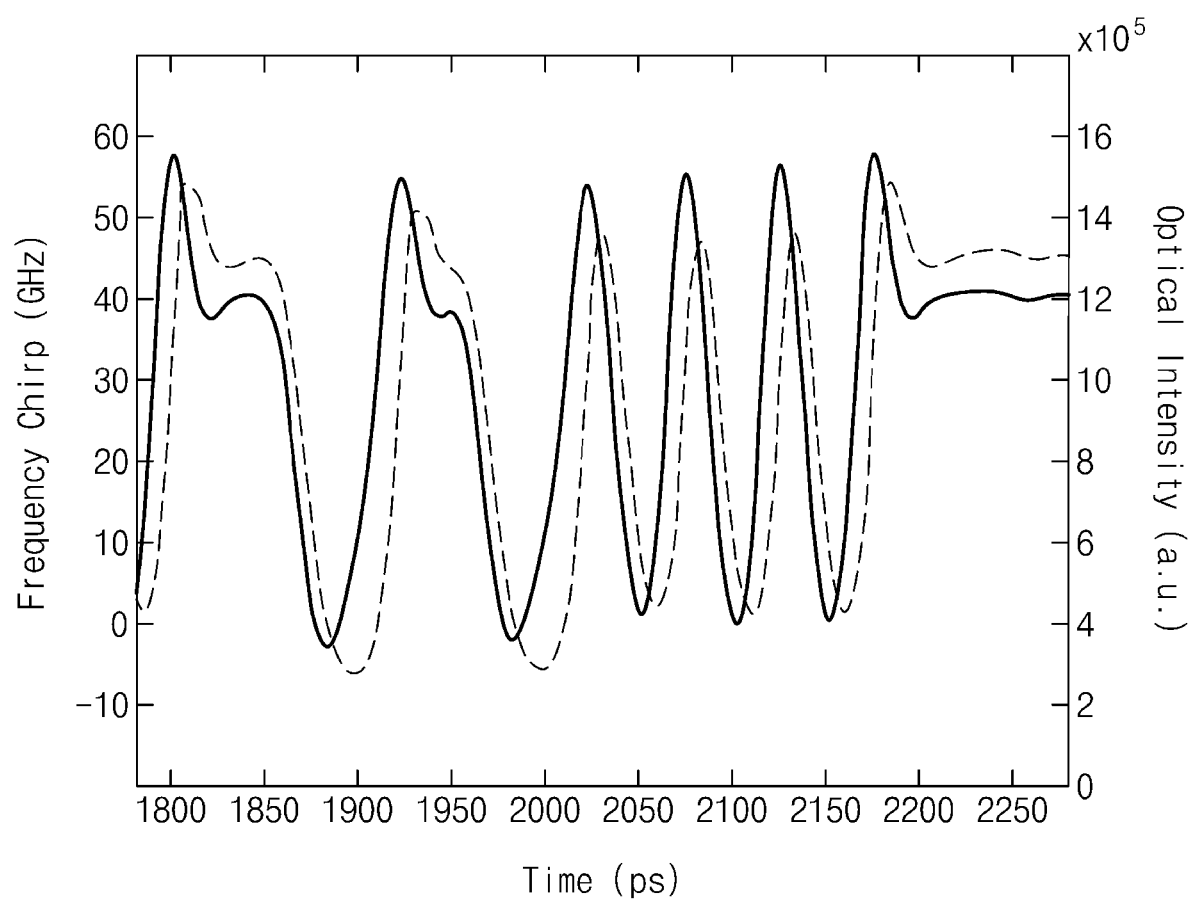
FIGS. 8A and 8B are diagrams describing how a frequency chirping phenomenon affects a light signal.
Figure 8B:
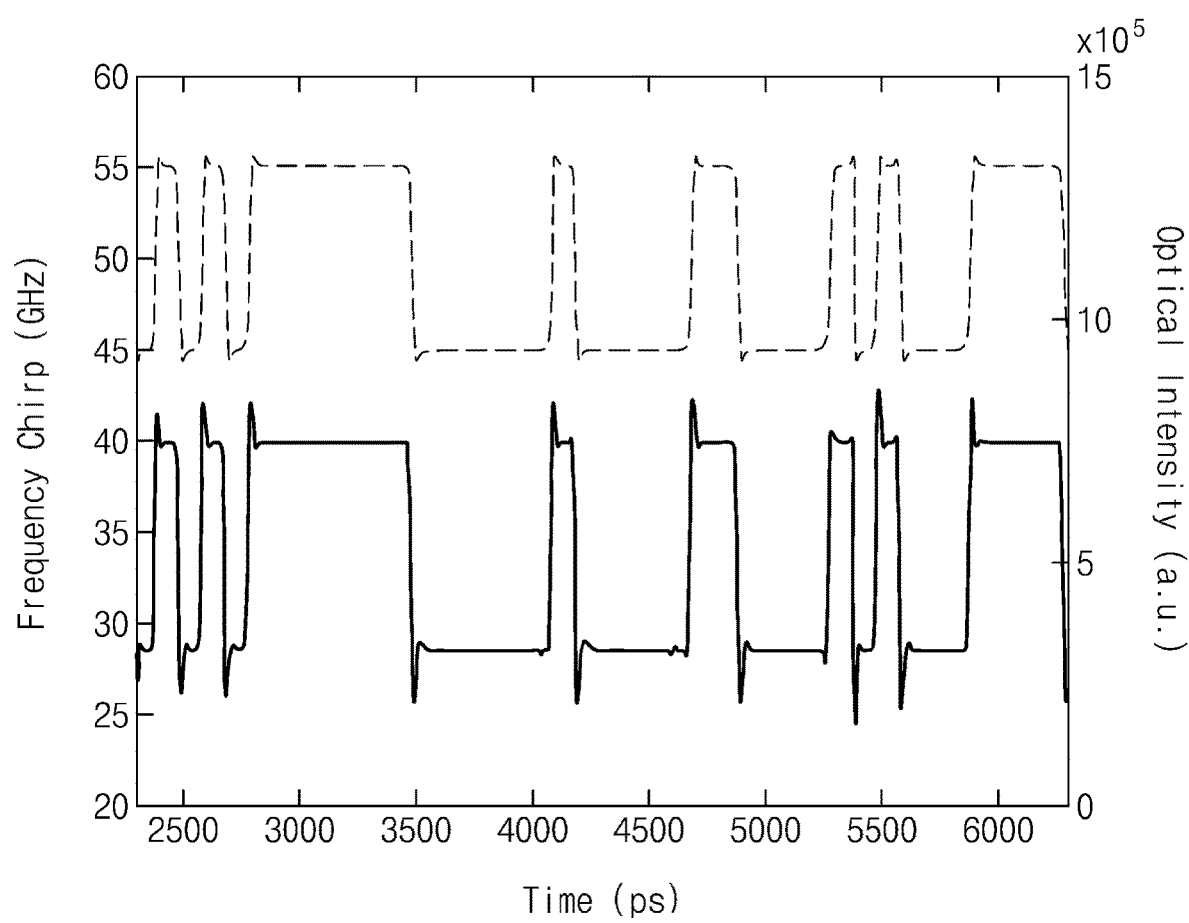

FIGS. 8A and 8B are diagrams describing how a frequency chirping phenomenon affects a light signal.

In FIGS. 8A and 8B, a dotted line represents an optical intensity of the light signal, and a solid line represents a waveform of the frequency chirped light signal. The light signal of FIG. 8A is a signal of 40 Gb/s, and the light signal of FIG. 8B is a signal of 10 Gb/s. When the laser diode directly modulates the light signal, a carrier density has a dynamic change due to the dynamic characteristics of the laser diode. When the gain changes due to the dynamic change in the carrier density, it may cause a change in the refractive index inside a laser diode resonator. When the refractive index is dynamically changed, the resonant frequency of the laser diode resonator is changed, resulting in the chirping phenomenon of the carrier frequency.

The frequency chirping phenomenon may be associated with a color dispersion effect of an optical fiber during high-speed modulation, resulting in a deterioration in the performance of the optical communication system. In detail, when the current is directly injected into the single mode laser, the refractive index seen by the light wave decreases as the gain momentarily increases due to the sudden injection of the carrier. In this case, the light wave generated under a resonance condition may be higher than a normal frequency. This frequency shift may contribute to a spread of a band. Therefore, to improve the quality of the wireless communication system, it is necessary to mitigate the frequency chirping phenomenon.

FIG. 9 is a diagram describing an effect of mitigating a frequency chirping phenomenon of a light signal generated by a dual mode laser according to an embodiment of the present disclosure.

FIG. 9 is an embodiment of the present disclosure, unlike the single mode laser illustrated in FIG. 7A, and illustrates a characteristic in which an applied voltage flows into the gain adjustment region 123 included in the dual mode laser 120 (refer to FIG. 4). Since there is no electrical signal directly applied to the first single mode laser 122a, the first beating signal generated by the first single mode laser 122a is not directly modulated by the laser diode. However, it is possible to modulate the first beating signal output from the first single mode laser 122a by directly applying the electric signal to the gain adjustment region 123. The second single mode laser 122b may output the second beating signal λ2 as it is.

The dual mode laser 120 may output the modulated first beating signal λ1 and the second beating signal λ2. In the embodiment of the present disclosure, the electric signal is directly applied to the dual mode laser 120, but since the light signal is not modulated by directly applying the electric signal to the single mode laser diode, the frequency chirping phenomenon may be mitigated. As the frequency chirping phenomenon is reduced, the degradation of the transmission quality of the terahertz wave wireless communication system to which the present disclosure is applied may be alleviated.

Figure 10:
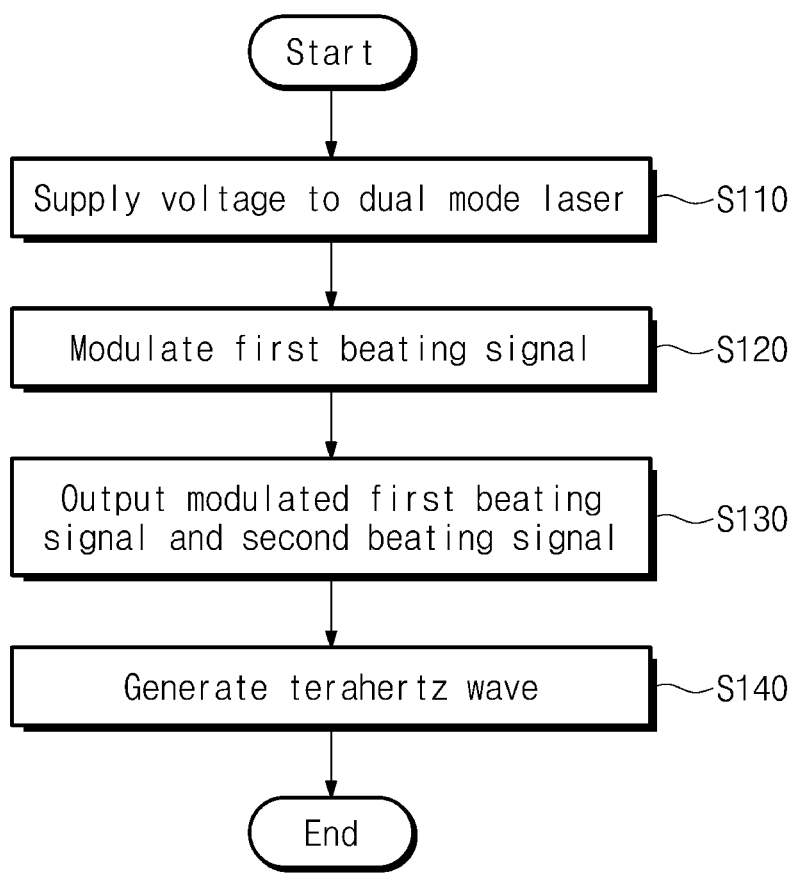
FIG. 10 is a flowchart describing a terahertz wave generating method according to an embodiment of the present disclosure.

FIG. 10 is a flowchart describing a terahertz wave generating method according to an embodiment of the present disclosure.

In operation S110, the dual mode laser 120 (refer to FIG. 4) of the terahertz wave generating apparatus 110a (refer to FIG. 2) may receive a voltage from the outside. The forward bias voltage may be applied to the first single mode laser 122a (refer to FIG. 4) and the second single mode laser 122b (refer to FIG. 4) included in the dual mode laser 120. The reverse bias voltage may be applied to the gain adjustment region 123 (refer to FIG. 4) included in the dual mode laser 120. The first single mode laser 122a and the second single mode laser 122b may generate the first beating signal and the second beating signal by the applied forward bias voltage. The first beating signal generated by the first single mode laser 122a may be output to the gain adjustment region 123.

In operation S120, the gain adjustment region 123 may modulate the incident first beating signal by using the applied reverse bias voltage. The active layer included in the gain adjustment region 123 may function as an absorbing layer. Accordingly, the first beating signal may be absorbed in the active layer of the gain adjustment region 123. The amount of light of the absorbed first beating signal may be proportional to the intensity of the reverse bias voltage applied to the gain adjustment region 123. The first beating signal may be modulated by absorption of light in the gain adjustment region 123.

In operation S130, the first beating signal modulated in the gain adjustment region 123 and the second beating signal generated by the second single mode laser 122b may be output from the dual mode laser 120. The modulated first beating signal and second beating signal may be incident on the photomixer 140 (refer to FIG. 2) that is connected in series with the dual mode laser 120. When the light intensity of the modulated first beating signal and the second beating signal is weak, the modulated first beating signal and the second beating signal may be incident on the semiconductor optical amplifier 130 (refer to FIG. 3) and may be amplified, and then may be incident on the photomixer 140.

In operation S140, the photomixer 140 may mix the modulated first beating signal and the second beating signal. Alternatively, the coupler 141 (refer to FIG. 5) included in the photomixer 140 may mix the modulated first beating signal and the second beating signal that are amplified by the semiconductor optical amplifier 130. The mixed beating signal S_Mix may be incident on the optical-to-electrical converter 142 (refer to FIG. 5). The optical-to-electrical converter 142 may generate the terahertz wave signal S_THz by modulating the current flowing through the photodiode in proportion to the light intensity of the mixed beating signal S_Mix.

Figure 11A:
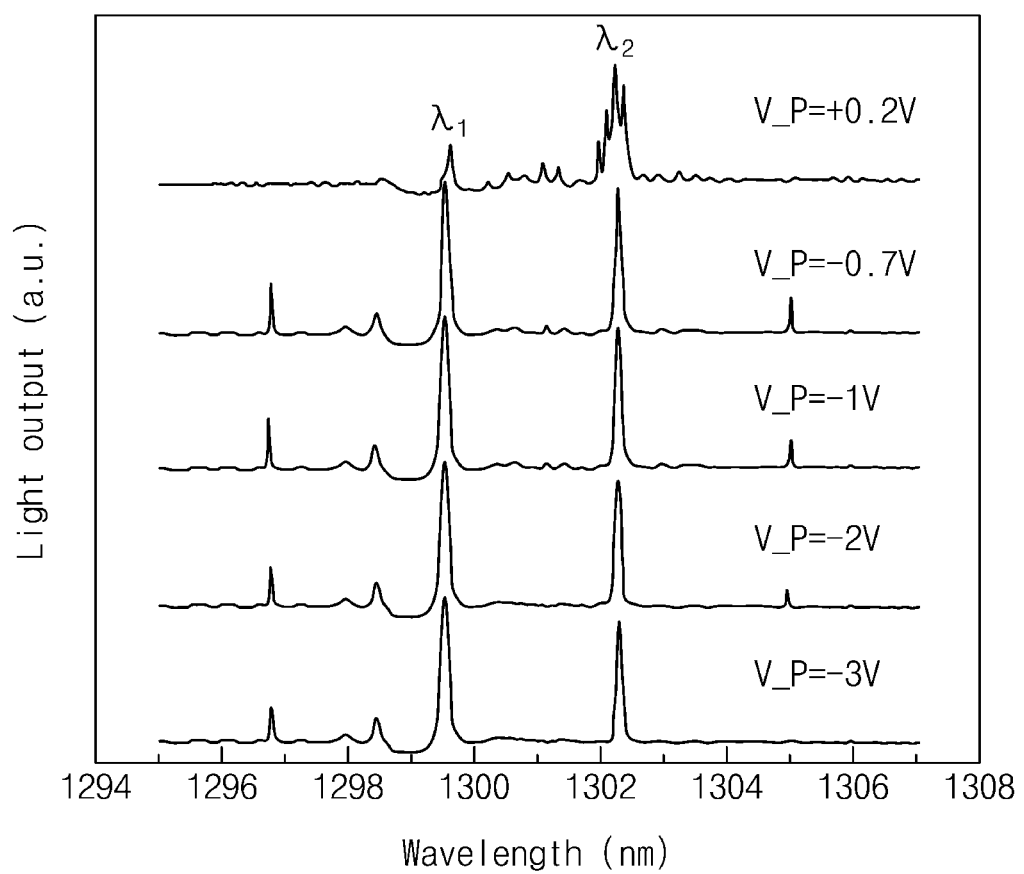
FIGS. 11A and 11B are diagrams describing a light output depending on an applied voltage in a gain adjustment region of a dual mode laser according to an embodiment of the present disclosure.
Figure 11B:
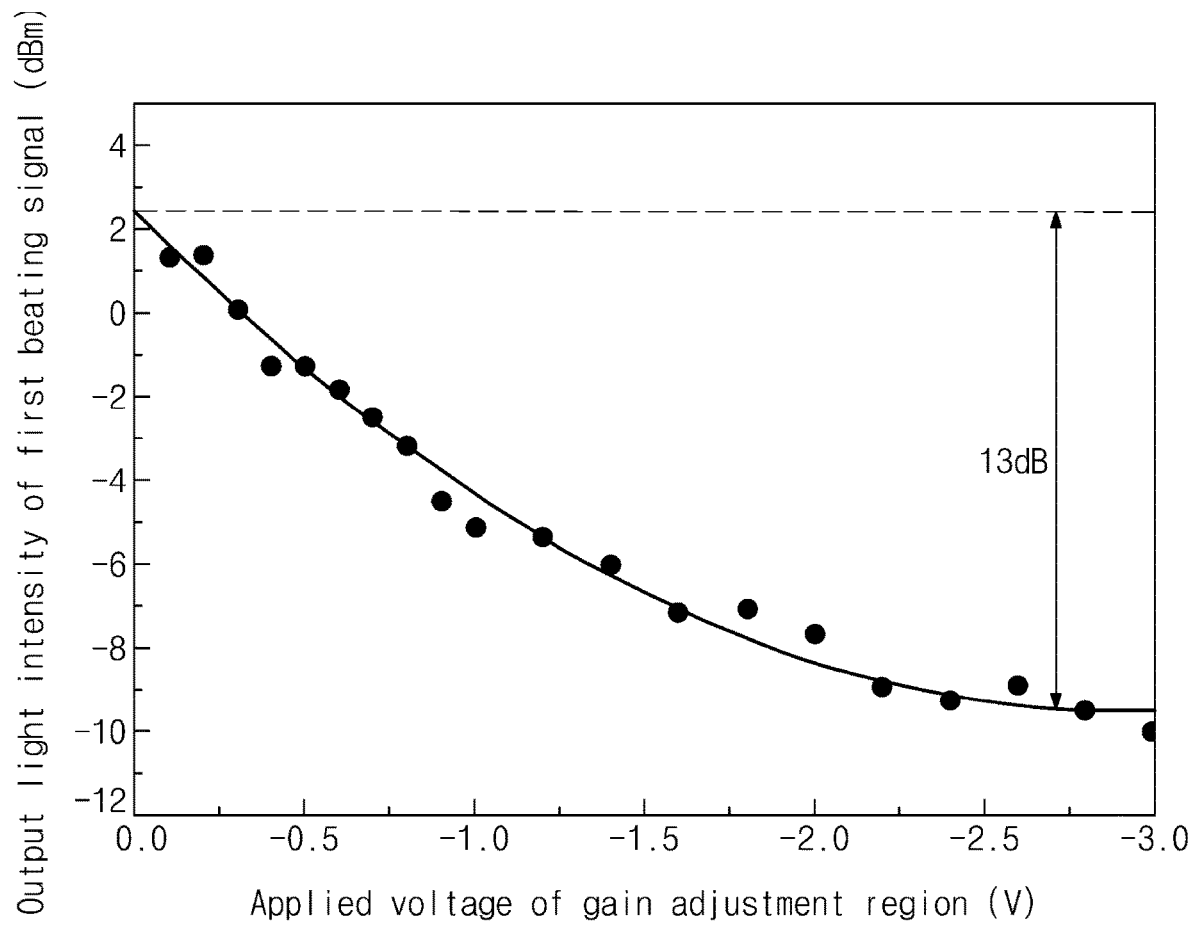

FIGS. 11A and 11B are diagrams describing a light output depending on an applied voltage in a gain adjustment region of a dual mode laser according to an embodiment of the present disclosure.

FIG. 11A illustrates a light output spectrum of the dual mode laser 120 depending on the applied voltage V_P (refer to FIG. 4) of the gain adjustment region 123 (refer to FIG. 4) included in the dual mode laser 120 (refer to FIG. 4). When the applied voltage V_P of the gain adjustment region 123 is the forward bias voltage (V_P=+0.2 V), it may be seen that the first beating signal λ1 and the second beating signal λ2 are not output with a single wavelength. When the applied voltage V_P of the gain adjustment region 123 is the reverse bias voltage (V_P=−0.7, −1, −2, −3 V), it may be seen that the first beating signal λ1 and the second beating signal λ2 are output with a single wavelength. In addition, as long as the applied voltage V_P of the gain adjustment region 123 is the reverse bias voltage (V_P=−0.7, −1, −2, −3 V), the output wavelength of the first beating signal 21 and the second beating signal 22 depending on the magnitude of the applied voltage V_P does not change.

In contrast, FIG. 11B illustrates the output light intensity of the first beating signal 21 depending on the applied voltage V_P of the gain adjustment region 123. Referring to FIG. 11B, it may be seen that as the magnitude of the applied voltage V_P of the gain adjustment region 123 increases, the output light intensity of the first beating signal 21 decreases. Therefore, to derive a desired light output in the terahertz wave generating apparatus 1000 according to an embodiment of the present disclosure, the reverse bias voltage is applied to the gain adjustment region 123, but the magnitude of the reverse bias voltage should be appropriately adjusted.

According to an embodiment of the present disclosure, a terahertz wave generating apparatus may generate a modulated terahertz wave by directly applying an electric signal to a gain adjustment region included in a dual mode laser.

According to an embodiment of the present disclosure, a terahertz wave generating apparatus may prevent deterioration of call quality in wireless communication by mitigating a frequency chirping phenomenon.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A terahertz wave generating apparatus comprising:
a dual mode laser including a first single mode laser configured to generate a first beating signal, a gain adjustment region configured to modulate the first beating signal, and a second single mode laser configured to generate a second beating signal; and
a photomixer configured to mix the modulated first beating signal and the second beating signal, and to modulate a current supplied based on a beating frequency of the mixed first beating signal and second beating signal to generate a terahertz wave signal, and
wherein the gain adjustment region is formed between the first single mode laser and the second single mode laser, and
wherein the first beating signal is output from the first single mode laser to the gain adjustment region and is modulated based on a reverse bias voltage supplied to the gain adjustment region.

2. The terahertz wave generating apparatus of claim 1, wherein the first single mode laser includes a first diffraction grating, a first gain layer, and a first electrode plate,
wherein the gain adjustment region includes an absorption layer and a second electrode plate, and
wherein the second single mode laser includes a second diffraction grating, a second gain layer, and a third electrode plate.

3. The terahertz wave generating apparatus of claim 2, wherein a diffraction period of the first diffraction grating is different from a diffraction period of the second diffraction grating.

4. The terahertz wave generating apparatus of claim 2, wherein the first gain layer, the absorption layer, and the second gain layer are formed of a same material.

5. The terahertz wave generating apparatus of claim 1, wherein the first single mode laser, the gain adjustment region, and the second single mode laser are formed on a same substrate.

6. The terahertz wave generating apparatus of claim 5, wherein the substrate is one of a gallium arsenide (GaAs) substrate, an indium phosphide (InP) substrate, and a gallium nitride (GaN) substrate.

7. The terahertz wave generating apparatus of claim 1, wherein at least one of the first single mode laser and the second single mode laser is a wavelength tunable single mode laser.

8. The terahertz wave generating apparatus of claim 1, wherein the first single mode laser and the second single mode laser are one of a distributed feedback laser diode (DFB LD), a distributed Bragg reflector laser diode (DBR LD), and a sampled grating distributed Bragg reflector laser diode (SGDBR LD).

9. The terahertz wave generating apparatus of claim 1, wherein the photomixer includes a coupler and a photoelectric converter.

10. The terahertz wave generating apparatus of claim 1, wherein the photomixer is one of a unitravelling carrier photodiode (UTC-PD), an evanescent photodiode (EC-PD), and a low temperature grown photomixer (LTG Photomixer).

11. A terahertz wave generating apparatus comprising:
a dual mode laser including a first single mode laser configured to generate a first beating signal, a gain adjustment region configured to modulate the first beating signal, and a second single mode laser configured to generate a second beating signal;
a semiconductor optical amplifier configured to amplify the modulated first beating signal and the second beating signal; and
a photomixer configured to mix the modulated first beating signal and the second beating signal which are amplified from the semiconductor optical amplifier, and to modulate a current supplied based on a beating frequency of the mixed first beating signal and second beating signal to generate a terahertz wave signal, and
wherein the gain adjustment region is formed between the first single mode laser and the second single mode laser, and
wherein the first beating signal is output from the first single mode laser to the gain adjustment region and is modulated based on a reverse bias voltage supplied to the gain adjustment region.

12. The terahertz wave generating apparatus of claim 11, wherein the first single mode laser includes a first diffraction grating, a first gain layer, and a first electrode plate,
wherein the gain adjustment region includes an absorption layer and a second electrode plate, and
wherein the second single mode laser includes a second diffraction grating, a second gain layer, and a third electrode plate.

13. The terahertz wave generating apparatus of claim 12, wherein a diffraction period of the first diffraction grating is different from a diffraction period of the second diffraction grating.

14. The terahertz wave generating apparatus of claim 12, wherein the first gain layer, the absorption layer, and the second gain layer are formed of a same material.

15. The terahertz wave generating apparatus of claim 11, wherein the first single mode laser, the gain adjustment region, and the second single mode laser are formed on a same substrate.

16. The terahertz wave generating apparatus of claim 11, wherein at least one of the first single mode laser and the second single mode laser is a wavelength tunable single mode laser.

* * * * *